United States Patent
Mostafazadeh et al.

(10) Patent No.: US 6,888,228 B1
(45) Date of Patent: May 3, 2005

(54) LEAD FRAME CHIP SCALE PACKAGE

(75) Inventors: Shahram Mostafazadeh, San Jose, CA (US); Joseph O. Smith, Morgan Hill, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 111 days.

(21) Appl. No.: 09/625,071

(22) Filed: Jul. 25, 2000

Related U.S. Application Data

(62) Division of application No. 09/054,422, filed on Apr. 2, 1998, now Pat. No. 6,130,473.

(51) Int. Cl.$^7$ .............................................. H01L 23/495
(52) U.S. Cl. ......................... 257/666; 257/676; 438/123
(58) Field of Search ................................ 257/666, 676, 257/787; 438/111, 123

(56) References Cited

U.S. PATENT DOCUMENTS

| | | | |
|---|---|---|---|
| 3,657,805 A | | 4/1972 | Johnson |
| 4,504,435 A | | 3/1985 | Orcutt |
| 4,672,418 A | | 6/1987 | Moran et al. |
| 4,896,418 A | | 1/1990 | Yearsley |
| 4,899,207 A | | 2/1990 | Hallowell et al. |
| 5,122,860 A | * | 6/1992 | Kikuchi et al. |
| 5,157,475 A | * | 10/1992 | Yamaguchi |
| 5,157,480 A | * | 10/1992 | McShane et al. |
| 5,177,591 A | | 1/1993 | Emanuel |
| 5,200,362 A | * | 4/1993 | Lin et al. |
| 5,273,938 A | * | 12/1993 | Lin et al. |
| 5,294,827 A | | 3/1994 | McShane |
| 5,521,429 A | * | 5/1996 | Aono et al. |
| 5,559,364 A | | 9/1996 | Hojyo |
| 5,640,746 A | | 6/1997 | Knecht et al. |
| 5,656,550 A | | 8/1997 | Tsuji et al. |
| 5,663,593 A | * | 9/1997 | Mostafazadeh et al. |
| 5,696,033 A | | 12/1997 | Kinsman |
| 5,844,315 A | | 12/1998 | Melton et al. |
| 5,973,388 A | * | 10/1999 | Chew et al. |
| 5,977,613 A | * | 11/1999 | Takata et al. |
| 6,033,933 A | * | 3/2000 | Hur |
| 6,117,710 A | * | 9/2000 | Mostafazadeh et al. |
| 6,130,473 A | * | 10/2000 | Moistafazadeh et al. |
| 6,143,981 A | * | 11/2000 | Glenn |
| 6,190,938 B1 | * | 2/2001 | Liu |
| 6,201,292 B1 | | 3/2001 | Yagi et al. |
| 6,215,179 B1 | | 4/2001 | Ohgiyama |
| 6,400,004 B1 | * | 6/2002 | Fan et al. |
| 6,424,024 B1 | * | 7/2002 | Shih et al. |

* cited by examiner

Primary Examiner—S. V. Clark
(74) Attorney, Agent, or Firm—Beyer Weaver & Thomas LLP

(57) ABSTRACT

In one aspect of the invention, a lead frame panel suitable for use in packaging an array of integrated circuits is described. The lead frame panel includes a matrix of tie bars that extend in substantially perpendicular rows and columns to define a two dimensional array of immediately adjacent device areas separated only by the tie bars. Each device area is suitable for use in an independent integrated circuit package and includes a die attach pad and a plurality of conductive contacts. In another aspect of the invention, a panel assembly suitable for use in simultaneously packaging a multiplicity of integrated circuits is described. The panel assembly includes a lead frame panel formed from a conductive sheet. The lead frame panel is patterned to define at least one two dimensional array of adjacent device areas. Each device area is suitable for use as part of an independent integrated circuit package and including a die and a plurality of contacts positioned around and electrically connected to the die. A molded cap is also provided that substantially uniformly covers a two dimensional array of adjacent device areas while leaving bottom surfaces of the conductive contacts exposed to facilitate electrical connection to external components. The encapsulation material that forms the molded cap is exposed at a bottom surface of the panel of integrated circuits to physically isolate the contacts.

28 Claims, 6 Drawing Sheets

191 SMALL OUTLINE PACKAGE (SOP)

192 PIN-THROUGH-HOLE (PTH)

193 PLASTIC LEADED CHIP CARRIER (PLCC)

LEAD FRAME CHIP SCALE PACKAGE

This application is a division of Ser. No. 09/054,422 Apr. 2, 19998 now U.S. Pat. No. 6,130,476.

BACKGROUND INFORMATION

1. Field of the Invention

The present invention relates to integrated circuit packages, and more specifically, to the production of a chip scale integrated circuit package using a lead frame.

2. Related Art

The use of a lead frame provides an inexpensive means for IC package manufacturing. Etching or stamping a sheet of thin metal to produce the desired lead frame patterns is a well-known manufacturing process, and is conducive to high-volume, low-cost production. In addition, the lead frame panel provides a support framework for the IC chips during IC package assembly. However, as FIGS. 1d-1 through 1d-3 show examples of common IC packages using lead frames. FIG. 1d-1 shows a small outline package (SOP) 191. FIGS. 1d-2 shows a pin-through hole (PTH) package 192. FIGS. 1d-3 shows a plastic leaded chip carrier (PLCC) 193.

As IC chip device densities increase and IC package sizes decrease, the geometries used in the electrical communication paths between the IC chip and the PCB decrease. For example, a chip scale package requires that the protective casing be no more than 20% larger than the IC chip. As a result, the area available for the electrical paths provided by the lead frame is significantly reduced, demanding much finer lead frame patterns. Accordingly, it is desirable to provide an IC packaging method that allows the use of a lead frame in a chip scale package.

SUMMARY OF THE INVENTION

The present invention provides a method for producing chip scale IC packages using lead frames. A temporary support fixture provides support and stability to a thin lead frame panel having the fine geometries required for high-density IC chip interfaces. An embodiment of the support fixture includes an adhesive pad made of one-sided sticky tape mounted to a rigid frame made of stainless steel, the rigid frame maintaining the adhesive pad in a fixed configuration providing a stable flat surface for support of the lead frame panel. Alternatively, the rigid frame and adhesive pad can be made of any materials compatible with the IC package manufacturing process and capable of supporting the lead frame panel through the manufacturing process. The adhesive pad can also be patterned to ease the manufacturing process. The rigid frame can include positioning features to assist in the alignment of the lead frame and adhesive pad. If encapsulant material is to be dispensed over the lead frame panel, a containment dam can be formed around the lead frame after it is installed on the adhesive pad, to provide a boundary for encapsulant material flow. In one aspect of the invention, a lead frame panel suitable for use in packaging an array of integrated circuits is described. The lead frame panel includes a matrix of tie bars that extend in substantially perpendicular rows and columns to define a two dimensional array of immediately adjacent device areas separated only by the tie bars. Each device area is suitable for use in an independent integrated circuit package and includes a die attach pad and a plurality of conductive contacts.

In another aspect of the invention, a panel assembly suitable for use in simultaneously packaging a multiplicity of integrated circuits is described. The panel assembly includes a lead frame panel formed from a conductive sheet. The lead frame panel is patterned to define at least one two dimensional array of adjacent device areas. Each device area is suitable for use as part of an independent integrated circuit package and including a die and a plurality of contacts positioned around and electrically connected to the die. A molded cap is also provided that substantially uniformly covers a two dimensional array of adjacent device areas while leaving bottom surfaces of the conductive contacts exposed to facilitate electrical connection to external components. The encapsulation material that forms the molded cap is exposed at a bottom surface of the panel of integrated circuits to physically isolate the contacts.

BRIEF DESCRIPTION OF THE DRAWINGS

FIGS. 1d-1 through 1d-3 show examples of common IC packages;

Use of the same reference number in different figures indicates similar or like elements.

DETAILED DESCRIPTION

Figure 1A:
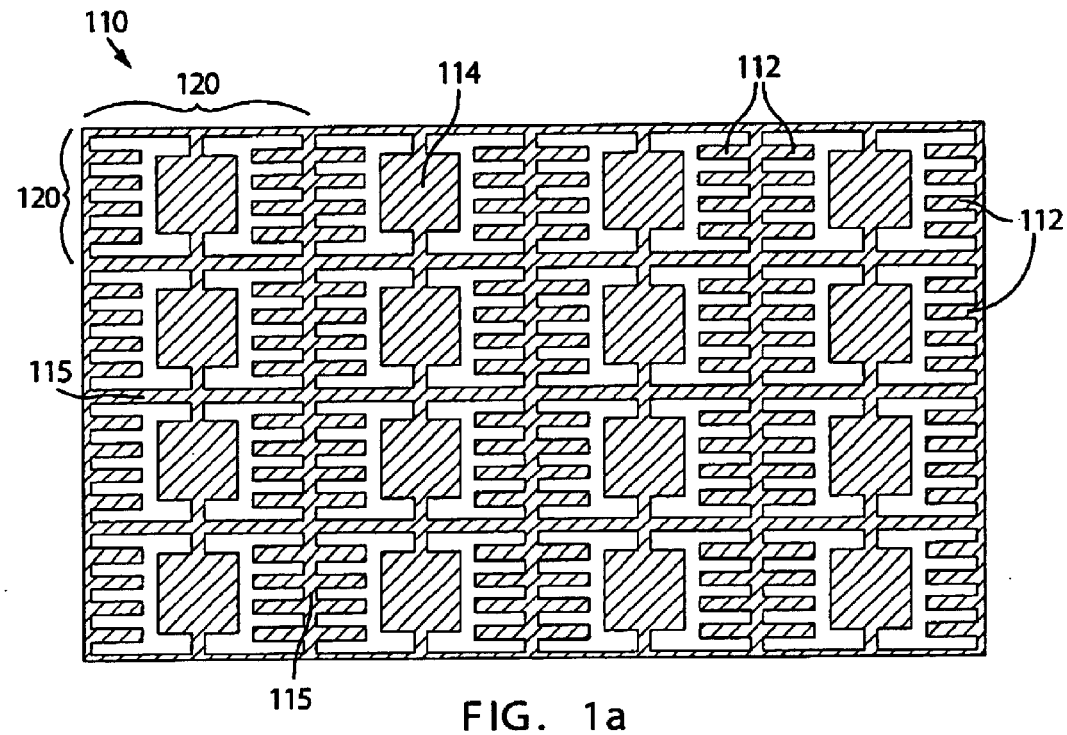
FIG. 1a shows a representation of a typical lead frame panel in accordance with ne embodiment of the present invention.
Figure 1B:
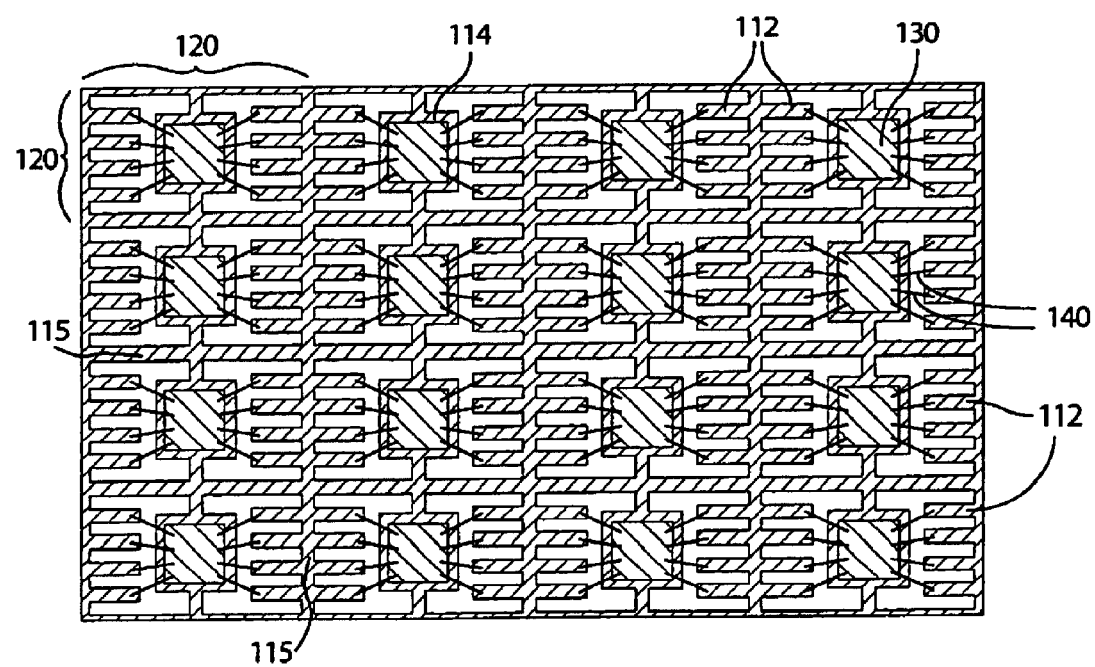
FIG. 1b shows the lead frame panel of FIG. 1a populated with IC chips.
Figures 1, 1C:
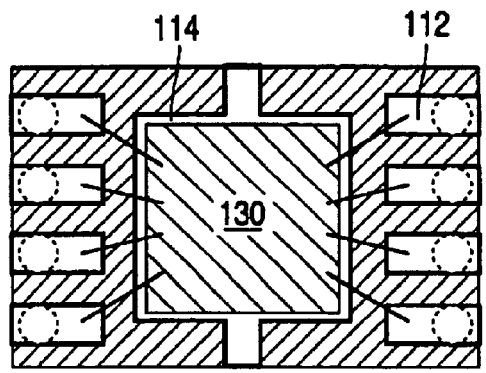
FIGS. 1c-1 and 1c-2 show bottom and cross sectional views of a single leadframe BGA IC package in accordance with another embodiment of the present invention.

Generally, an integrated circuit (IC) package encapsulates an IC chip, or die, in a protective casing and also provides power and signal distribution between the IC chip and an external printed circuit board (PCB). A metal lead frame can be used to provide the electrical paths for that distribution. A lead frame panel suitable for use in accordance with the present invention is illustrated in FIG. 1a. For production purposes, a lead frame panel 110 made up of multiple lead frames 120 is etched or stamped from a thin sheet of metal, as shown in FIG. 1a. An IC chip 130 is then mounted and wire bonded to each lead frame 120, as shown in FIG. 1b. Wire bonding is typically performed using fine gold wires 140. As illustrated in FIG. 1c, each IC chip 130 is then encapsulated in a protective casing 160 which may be formed by dispensing and molding a layer of encapsulant material over all IC chips 130. Next lead frames 120 are cut apart, or singulated to produce individual IC packages 190.

Referring again to FIG. 1a, panel 110 includes a two dimensional array of device areas. Each device area has a plurality of contacts 112 and a die attach pad 114. The panel has a grid of tie bars 115 that extend in perpendicular rows and columns to define the device areas. The tie bars 115 carry the contacts 112 and die attach pads 114.

Figure 2A:
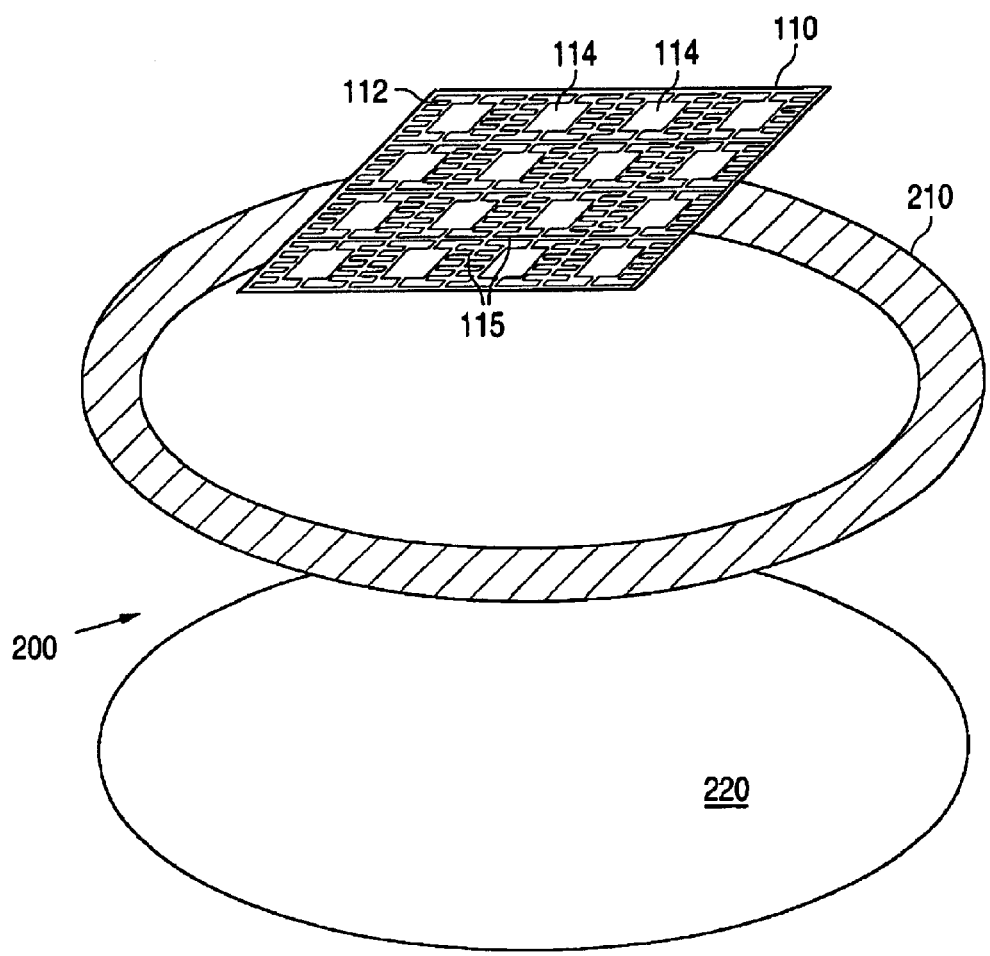
FIG. 2a shows an embodiment of a rigid support fixture.
Figure 2B:
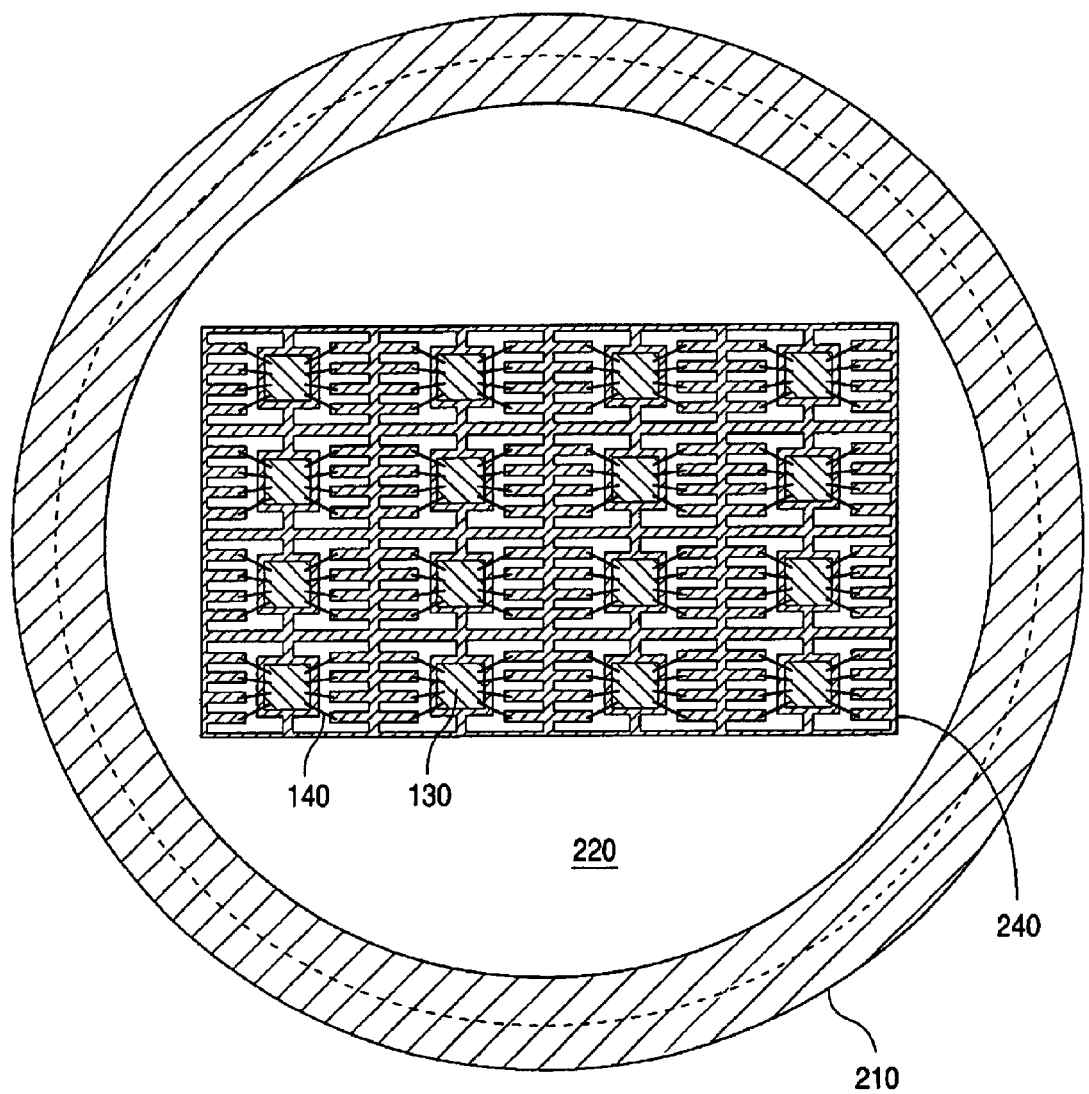
FIG. 2b shows a lead frame panel mounted on an embodiment of a support fixture.

The embodiment shown in FIG. 2a employs a rigid supporting fixture during the manufacturing process to enable the use of lead frames in chip scale IC packages. An embodiment of a support fixture 200 includes a rigid frame 210 and an adhesive pad 220, as shown in the exploded isometric diagram of FIG. 2a. Because pad 220 is affixed along its border to frame 210, it maintains sufficient tension to provide a stable supporting surface for a lead frame panel 110. By making pad 220 out of a thin, flexible, and electrically non-conductive material, it provides a support structure that will not interfere with the conventional manufacturing processes used in IC package assembly. The size of the interior opening of frame 210 is large enough to allow lead frame panel 110 to be fully supported by pad 220. Multiple IC chips 130 are then installed and wire bonded on lead frame panel 110, as shown in FIG. 2b. Subsequent encapsulation of IC chips 130 in protective casings proceeds as in conventional lead frame processing. If a molded protective casing is to be applied, an encapsulant dam 240 can be constructed around the perimeter of lead frame panel 110. Dam 240 can be made of any substantially rigid substance, including premolded plastic, epoxy, or tape, and serves to prevent flow of encapsulant material beyond the boundaries of lead frame panel 110. Alternatively, containing measures for encapsulant material could be incorporated into the dispensing mechanism. Once encapsulation is complete, support fixture 200 can be removed, either before or after singulation.

The embodiment of the present invention shown in FIGS. 2a and 2b can be constructed from common and readily available materials. Pad 220 can be made from a 3M or Nitto-brand sticky tape used in conventional wafer saw operations. Likewise, a stainless steel ring of the type used in conventional wafer saw operations can be employed for frame 210. However, both pad 220 and frame 210 can be implemented in many different ways as well. For example, frame 210 can be constructed from any rigid material compatible with the IC package assembly process, such as copper, aluminum, or even non-metals such as ceramic or plastic. Also, while depicted as a thin circular element, frame 210 can also take a variety of configurations depending on handling, interface, and user requirements. For instance, frame 210 can include positioning features to ensure consistent alignment for lead frame panel 110 and adhesive pad 220. A circular outline for frame 210 provides compatibility with conventional handling requirements for IC production, but is not a required aspect of the present invention.

Similarly, numerous implementations of adhesive pad 220 are possible. Any material compatible with the IC package assembly process and capable of providing the necessary support to the lead frame panel and IC chips can be used. The sticky tape mentioned previously is a convenient choice due to widespread current usage and availability. The use of one-sided sticky tape enables pad 220 to be applied to the bottom surface of frame 210 and provide an adhesive surface for mounting of lead frame panel 10, without requiring additional attachment materials or components. Pad 220 can also be patterned by removing selected portions in order to facilitate subsequent assembly operations such as electrical interconnection formation. Removal of pad 220 once packaging is complete can be performed in various ways, depending on the nature of the adhesive material used. A light adhesive material may allow pad 220 to simply be peeled away from frame 110. An alternative bonding agent requires exposure to UV light before removal of pad 220 can take place.

Figures 1, 1C, 2:
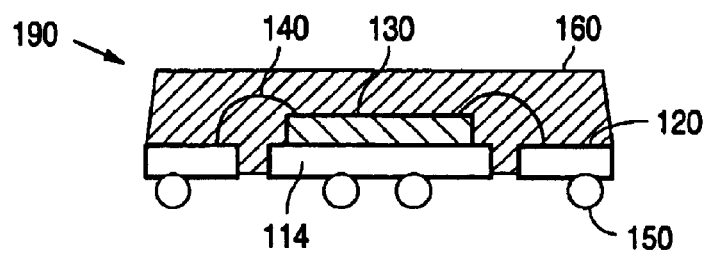
Figures 1, 1D:
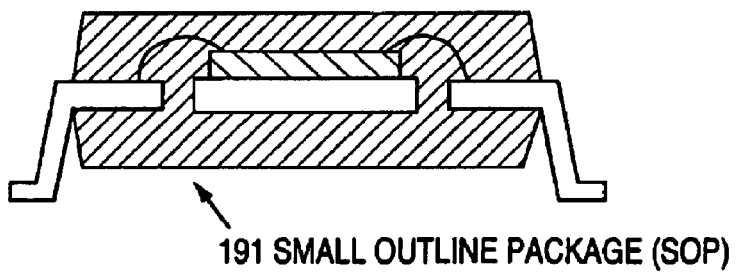
Figures 1, 1D, 2:
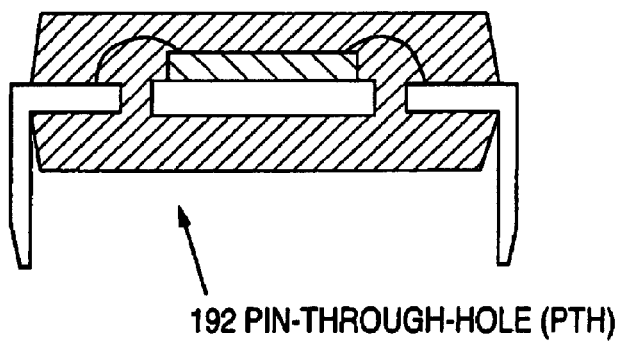
Figures 1, 1D, 2, 3:
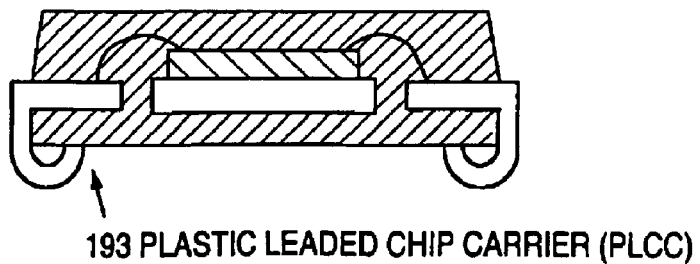
Figure 3A:
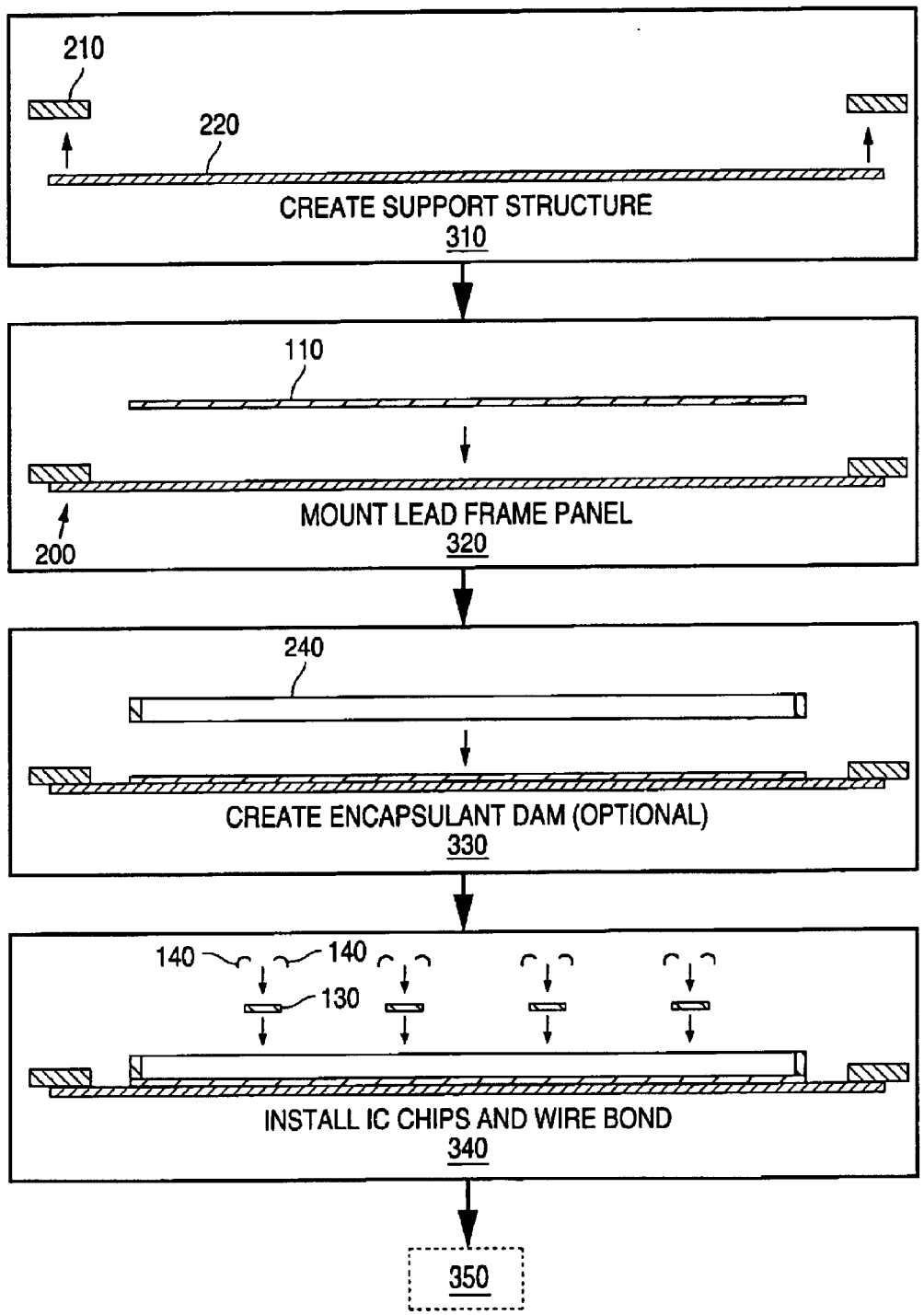
FIGS. 3a and 3b show a flow diagram of a manufacturing process using a temporary support fixture.
Figure 3B:
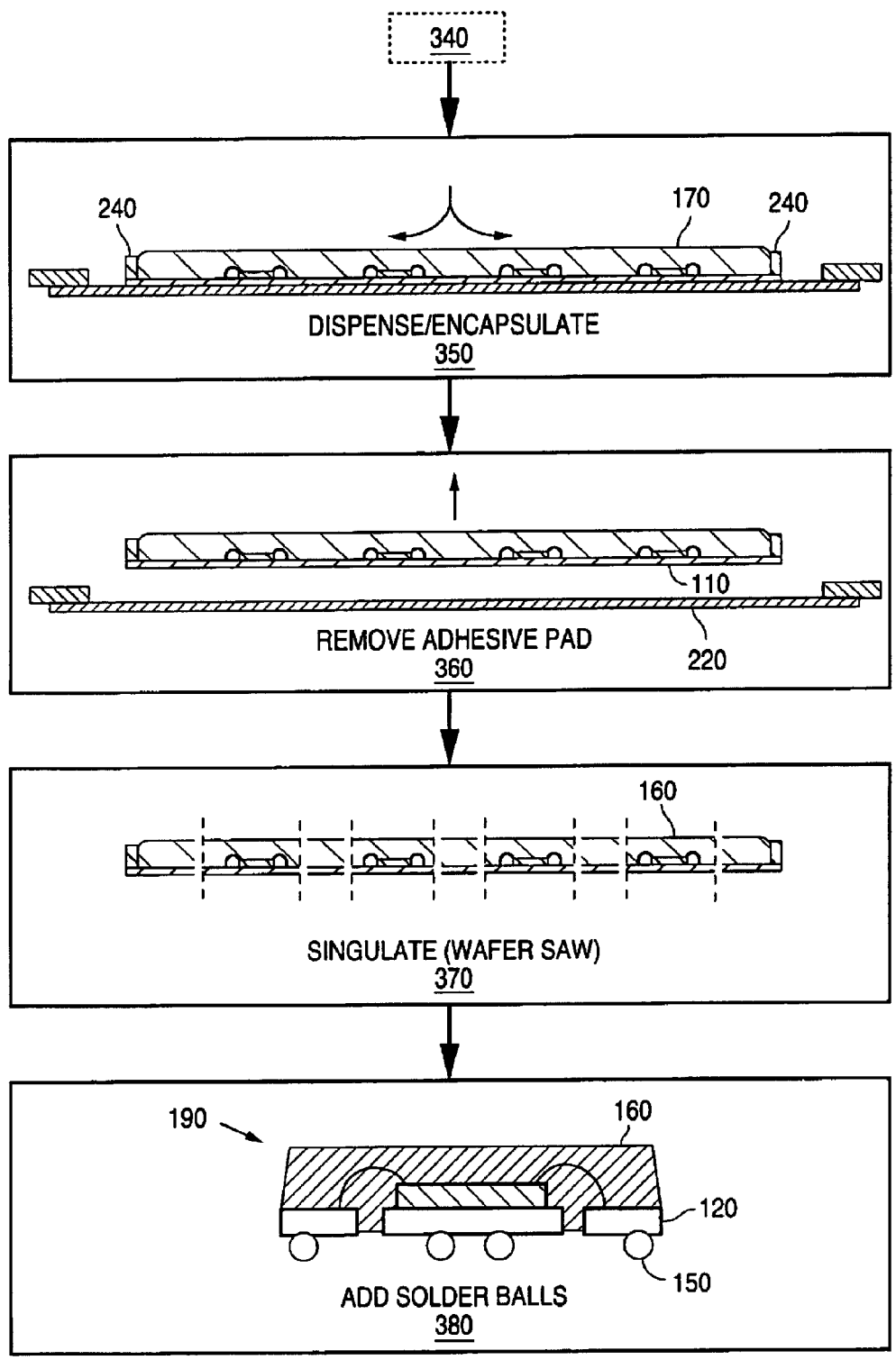

FIGS. 3a and 3b show a graphical flow chart illustrating a method for manufacturing a lead frame BGA package using an embodiment of the present invention. The manufacturing process is described in conjunction with the elements described in FIGS. 2a–2c. In a step 310 in FIG. 3a, adhesive pad 220 is applied to rigid frame 210 to create support fixture 200. Lead frame panel 110 is then mounted on pad 220 in a step 320. An optional step 330 allows encapsulant dam 240 to be applied around the border of lead frame panel 110 if subsequent encapsulant material dispensing is to be performed. Next, an IC chip 130 is mounted and wire bonded onto each of the lead frames 120 of lead frame panel 110. Continuing the process in FIG. 3b, a step 350 involves dispensing a portion of encapsulant material 170 into the area defined by dam 240 to cover IC chips 130, and then curing material 170 to a desired hardness. In a step 360, pad 220 is removed from lead frame panel 110. Next, in a step 370, a wafer saw operation is performed to singulate lead frame panel 110 into individual IC packages. The singulation process converts the layer of hardened encapsulant material 170 into individual protective casings 160. Finally, in a step 380, solder balls 150 are applied to desired electrical interconnection locations to complete lead frame BGA IC package 190.

In this manner a lead frame BGA IC package can be produced using a temporary support structure. This enables the production of IC packages using lead frames that would otherwise be too fragile to withstand conventional manufacturing processes. It should be noted that while particular embodiments of the present invention have been shown and described, it will be apparent to those skilled in the art that many modifications and variations thereto are possible, all of which fall within the true spirit and scope of the invention. For example, the wafer saw operation of step 370 can be performed prior to removal of support fixture 200 from lead frame panel 110. Also, solder balls 150 could be applied to lead frames 120 in step 370 prior to singulation. Alternatively, appropriately located openings in adhesive pad 220 would allow solder balls 150 to be applied without removing pad 220. Certain lead frame designs may even allow patterning of pad 220 such that removal is unnecessary. Finally, while the present invention has been described with reference to chip scale IC package manufacturing, it can be applied to any IC package manufacturing process involving lead frames, including non-chip scale and non-BGA IC packages such as SOP's, PLCC's, and PTH packages.

What is claimed is:

1. A panel suitable for forming a multiplicity of integrated circuit packages, each integrated circuit package being arranged for accommodating an associated semiconductor die, the panel comprising a lead frame panel having a two dimensional matrix array of device areas, each device area being suitable for forming an independent integrated circuit package and comprising:

a planar lead frame comprising (a) a die attach pad supporting said semiconductor die on an upper surface of said die attach pad, and (b) substantially planar conductive leads positioned around an outer periphery of said die attach pad, wherein each of said conductive leads has a lower surface that is substantially coplanar with said lower surface of said die attach pad, said upper and lower surfaces of said die attach pad being located on opposite sides of said die attach pad;

a plurality of bond wires each coupling one of said conductive leads to a corresponding bonding pad on said semiconductor die; and a plastic encapsulation enclosing said semiconductor die, said bond wires and said lead frame, exposing at a lower surface of said plastic encapsulation said lower surface of said die attach pad and said lower surfaces of said conductive leads, wherein the plastic encapsulation is part of a molded cap that covers the two dimensional matrix array of the device areas.

2. An integrated circuit package as in claim 1, further comprising a solder ball attached to each of said exposed lower surface of said conductive leads.

3. An integrated circuit package for accommodating a semiconductor die, comprising:
- a planar lead frame comprising (a) a die attach pad supporting said semiconductor die on an upper surface of said die attach pad, and (b) substantially planar conductive leads positioned around an outer periphery of said die attach pad, wherein each of said conductive leads has a lower surface that is substantially coplanar with said lower surface of said die attach pad, said upper and lower surfaces of said die attach pad being located on opposite sides of said die attach pad;
- a plurality of bond wires each coupling one of said conductive leads to a corresponding bonding pad on said semiconductor die; and
- a plastic encapsulation enclosing said semiconductor die, said bond wires and said lead frame, exposing at a lower surface of said plastic encapsulation said lower surface of said die attach pad and said lower surfaces of said conductive leads; and
- an adhesive pad removably attached to said integrated circuit package, covering said lower surface of said die attach pad and said lower surfaces of said conductive leads, and
- wherein said integrated circuit package is one of a plurality of integrated circuit packages fabricated simultaneously on a lead frame panel that includes said lead frame, said lead frame panel comprising a two dimensional matrix array of devices areas wherein each device area includes a die attach pads and conductive leads that are positioned under the plastic encapsulation, and wherein said adhesive pad supports the array of die attach pads and conductive leads prior to singulation of the plurality of integrated circuit packages.

4. An integrated circuit package as in claim 3, wherein said lead frame is fabricated on a metal panel.

5. An integrated circuit package as in claim 3, wherein said array of die attach pads and conductive dies is being arranged in a regular pattern so as to allow singulation of said integrated circuit packages by sawing through said plastic encapsulation and said conductive leads at predetermined positions.

6. A lead frame panel suitable for use in packaging an array of integrated circuits, the lead frame panel being formed from a conductive sheet and having top and bottom surfaces, the lead frame panel comprising:
- a matrix of tie bars that extend in substantially perpendicular rows and columns to define a two dimensional array of immediately adjacent device areas separated only by the tie bars, each device area being suitable for use in an independent integrated circuit package;
- a multiplicity of die attach pads; and
- a multiplicity of conductive contacts, the conductive contacts being mechanically carried by the tie bars; and
- wherein each device area in the two dimensional array of immediately adjacent device areas includes one of the die attach pads and a plurality of the conductive contacts that are positioned generally adjacent the die attach pad.

7. A lead frame panel as recited in claim 6 wherein at least one of the top and bottom surfaces of the die attach pads, the conductive contacts and the tie bars are all substantially co-planar.

8. A lead frame panel as recited in claim 7 wherein the conductive contacts and the die attach pads are substantially the same thickness.

9. A lead frame panel as recited in claim 6 further comprising an adhesive tape adhered to a bottom surface of the lead frame panel.

10. A panel assembly of integrated circuits comprising:
- a lead frame panel as recited in claim 6,
- a plurality of dice, each die being carried by an associated die attach pad; and a molded cap that covers the array of device areas while leaving bottom surfaces of the die attach pads and the conductive contacts exposed, wherein encapsulation material that forms the molded cap is exposed at a bottom surface of the panel assembly.

11. A packaged integrated circuit formed by singulating the panel assembly recited in claim 10, wherein the conductive contacts in the packaged integrated circuit do not extend beyond the edge of the encapsulation material in the packaged integrated circuit and the die attach pad in the packaged integrated circuit is exposed.

12. A packaged integrated circuit as recited in claim 11 wherein the conductive contacts and the die attach pad are substantially the same thickness.

13. A panel assembly as recited in claim 10 further comprising an adhesive tape adhered to a bottom surface of the lead frame panel, whereby the adhesive tape serves to keep the exposed surface of the exposed encapsulation material substantially co-planar with the bottom surfaces of the contacts and die attach pads.

14. A panel assembly suitable for use in packaging a multiplicity ay of integrated circuits simultaneously, the panel assembly having top and bottom surfaces and comprising:
- a lead frame panel formed from a conductive sheet, the lead frame panel being patterned to define at least one two dimensional array of adjacent device areas, each device area being suitable for use as part of an independent integrated circuit package and including a die and a plurality of contacts positioned around and electrically connected to the die; and
- a molded cap that substantially uniformly covers the two dimensional array of adjacent device areas while leaving bottom surfaces of the conductive contacts exposed to facilitate electrical connection to external components, wherein encapsulation material that forms the molded cap is exposed at a bottom surface of the panel of integrated circuits to physically isolate the contacts.

15. A panel assembly as recited in claim 14 wherein:
- each device area in the lead frame panel further includes a die attach pad; and
- bottom surfaces of the die attach pads are also exposed.

16. A panel assembly as recited in claim 15 wherein the die attach pads and the conductive contacts each have upper and lower surfaces that substantially co-planar.

17. A panel assembly as recited in claim 16 wherein the conductive contacts and the die attach pads are substantially the same thickness.

18. A panel assembly as recited in claim 14 further comprising an adhesive tape adhered to a bottom surface of the lead frame panel, whereby the adhesive tape serves to keep the encapsulation material exposed at the bottom of the panel assembly substantially co-planar with the bottom surfaces of the contacts and die attach pads.

19. A panel assembly as recited in claim 14 further comprising bonding wires for electrically coupling the dice to their associated contacts, wherein the molded cap encapsulates the bonding wires.

20. A packaged integrated circuit formed by singulating the panel assembly recited in claim 14, wherein the conductive contacts in the packaged integrated circuit do not extend beyond the edge of the encapsulation material that is part of the packaged integrated circuit.

21. A packaged integrated circuit as recited in claim 20 wherein the integrated circuit is singulated by sawing the panel assembly along substantially perpendicular lines.

22. A, panel assembly suitable for use in packaging a multiplicity of integrated circuits, the panel assembly having top and bottom surfaces and comprising:

a lead frame panel formed from a conductive sheet, the lead frame panel being patterned to define at least one two dimensional array of adjacent device areas, each device area being suitable for use as part of an independent integrated circuit package and including a plurality of contacts;

a plurality of dice, each die being associated with one of the device areas and being electrically connected to the associated contacts; and a molded cap that covers the two dimensional array of adjacent device areas while leaving bottom surfaces of the contacts exposed to facilitate electrical connection to external components, wherein encapsulation material that forms the molded cap is exposed at a bottom surface of the panel of integrated circuits to physically isolate the contacts; and an adhesive pad adhered to a bottom surface of the lead frame panel, whereby the adhesive pad serves to keep the encapsulation material exposed at the bottom of the panel assembly substantially co-planar with the bottom surfaces of the contacts and die attach pads.

23. A panel assembly as recited in claim 22 wherein:

each device area in the lead frame panel further includes a die attach pad; and bottom surfaces of the die attach pads are also exposed.

24. A panel assembly as recited in claim 23 wherein the lead frame panel further comprises tie bars that support the contact, wherein the device areas are substantially immediately adjacent one another with only the tie bars residing therebetween.

25. A panel assembly as recited in claim 24 wherein at least one of top and bottom surfaces of the die attach pads, the contacts and tie bars are substantially co-planar.

26. A panel assembly as recited in claim 23 wherein the conductive contacts and the die attach pads are substantially the same thickness.

27. A panel assembly as recited in claim 22, further comprising bonding wires for electrically coupling the dice to their associated contacts, wherein the molded cap encapsulates the bonding wires.

28. A packaged integrated circuit formed by singulating the panel assembly recited in claim 22, wherein the contacts in the packaged integrated circuit do not extend beyond the edge of the encapsulation material that is part of the packaged integrated circuit.

\* \* \* \* \*

UNITED STATES PATENT AND TRADEMARK OFFICE
CERTIFICATE OF CORRECTION

PATENT NO. : 6,888,228 B1
DATED : May 3, 2005
INVENTOR(S) : Mostafazadeh et al.

It is certified that error appears in the above-identified patent and that said Letters Patent is hereby corrected as shown below:

Column 1,
Line 19, delete "However, as".
Lines 38-56, delete "A temporary support fixture provides support and stability to a thin lead frame panel having the fine geometries required for high-density IC chip interfaces. An embodiment of the support fixture includes an adhesive pad made of one-sided sticky tape mounted to a rigid frame made of stainless steel, the rigid frame maintaining the adhesive pad in a fixed configuration providing a stable flat surface for support of the lead frame panel. Alternatively, the rigid frame and adhesive pad can be made of any materials compatible with the IC package manufacturing process and capable of supporting the lead frame panel through the manufacturing process. The adhesive pad can also be patterned to ease the manufacturing process. The rigid frame can include positioning features to assist in the alignment of the lead frame and adhesive pad. If encapsulant material is to be dispensed over the lead frame panel, a containment dam can be formed around the lead frame after it is installed on the adhesive pad, to provide a boundary for encapsulant material flow".

Column 2,
Line 17, delete "typical".
Line 18, change "ne embodiment" to -- one embodiment --.

Column 3,
Line 49, change "panel 10" to -- panel 110 --.

Column 6,
Line 30, change "multiplicity ay of" to -- multiplicity of --.
Line 54, change "that substantially" to -- that are substantially --.

Signed and Sealed this

Twenty-sixth Day of July, 2005

JON W. DUDAS
*Director of the United States Patent and Trademark Office*